United States Patent [19]

Nakamura et al.

[11] Patent Number: 4,692,789

[45] Date of Patent: Sep. 8, 1987

[54] SEMICONDUCTOR APPARATUS

[75] Inventors: Yoshio Nakamura; Susumo Sugiyama, both of Aichi; Jun-ichi Nishizawa; Tadahiro Ohmi, both of Miyagi, all of Japan

[73] Assignee: Kabushiki Kaisha Toyota Chuo Kenkyusho, Aichi, Japan

[21] Appl. No.: 516,543

[22] Filed: Jul. 22, 1983

[30] Foreign Application Priority Data

Jul. 23, 1982 [JP] Japan ................. 57-127584
Oct. 30, 1982 [JP] Japan ................. 57-189983

[51] Int. Cl.$^4$ ............................................. H01L 23/02
[52] U.S. Cl. ........................................ 357/74; 357/69; 357/75
[58] Field of Search .................. 357/69, 79, 70–75

[56] References Cited

U.S. PATENT DOCUMENTS

| 3,710,202 | 1/1973 | Leidich et al. ......................... 357/74 |
| 3,893,159 | 7/1975 | Martin ..................................... 357/75 |
| 4,297,722 | 10/1981 | Nagahama et al. ................... 357/74 |
| 4,518,982 | 5/1985 | Du Bois et al. ....................... 357/74 |
| 4,527,010 | 7/1985 | Anazawa et al. ............... 174/52 FP |

FOREIGN PATENT DOCUMENTS

| 40974 | 3/1977 | Japan ..................................... 357/74 |
| 132265 | 11/1978 | Japan ..................................... 357/74 |

Primary Examiner—William L. Sikes
Assistant Examiner—Frank González

[57] ABSTRACT

In a semiconductor apparatus for controlling a large current at a high speed, a lead conductor coupled to a control electrode of a semiconductor device sealed in a package comprises a conductor plate having a width equal to or greater than one side or a diameter of the semiconductor device, thereby decreasing impedance against a high-frequency input signal.

8 Claims, 22 Drawing Figures

SEMICONDUCTOR APPARATUS

BACKGROUND OF THE INVENTION

I. Field of the Invention

The present invention relates to a semiconductor apparatus for controlling a large current at a high operating speed and, more particularly, to an improvement in the structure of the semiconductor apparatus.

II. Description of the Prior Art

Various types of power control equipment have been recently controlled with high precision and high efficiency using a high-power semiconductor device. A high-speed, high-power semiconductor device having a small power loss has been demanded in the field of power control equipment. When high-power switching is controlled by using the low-speed semiconductor device, a control frequency cannot be increased and is kept in an audio frequency region. Noise from such power control equipment causes discomfort to an operator. In addition to this disadvantage, a switching loss of the semiconductor device is so great that proper heat dissipation cannot be obtained. On the other hand, along with recent developments in semiconductor techniques, the switching speed of a high-power semiconductor device has been greatly increased. For example, a device for switching a current of several hundreds of amperes in a very short time interval of 0.1 $\mu$sec or less has been developed. When this device is applied in the field of power control equipment, high-performance power control equipment can be provided wherein a switching loss is negligible even if its operating frequency is significantly higher than the audio frequencies.

Although such a semiconductor device is generally encapsulated in a package for practical application, thin lead wires are conventionally connected to control the electrodes of packed semiconductor devices such as a transistor and a thyristor. When such thin lead wires are used, an external signal supplied to the control electrode lead end of the semiconductor device is delayed due to the impedance of the thin lead wire. Furthermore, overshooting may occur due to an inductance component. These cause waveform distortion. In particular, when the high current thyristor of the high current transistor is turned off, the large current must be absorbed by their control electrodes. In this case, the influence of impedance and inductance of thin lead wires is typically observed, thus preventing high-speed operation. In semiconductor devices such as a static induction thyristor (SIThy) and a bipolar mode static induction transistor (BSIT), since a large number of electrons and holes are injected in the channel during the conducting state, injected electrons or holes must be absorbed by the control electrode from the channel region at the turn-off process. When the turn-off speed is increased, an instantaneous current flowing through the control electrode is increased.

In the conventional semiconductor apparatus, even if the semiconductor device is capable of controlling a large current with high speed operation, the impedance of the lead wires connected thereto is increased at the instance of high speed switching and a large voltage drop appears due to this impedance, and thus the operating speed of the device cannot be greatly increased.

SUMMARY OF THE INVENTION

It is an object of the present invention to provide a semiconductor apparatus for controlling a high current by decreasing an impedance of a lead conductor connected to an electrode of a semiconductor device substrate when the semiconductor device is operated at a high speed.

In order to achieve the above object of the present invention, there is provided a semiconductor apparatus comprising: a semiconductor device substrate having a plurality of main electrodes and a single control electrode, first and second lead conductors connected to the main electrodes, and a third lead conductor connected to the control electrode, the apparatus being characterized in that the third lead conductor has a width substantially equal to or greater than one side or a diameter of the semiconductor device substrate in order to obtain a low impedance of the third lead conductor, unlike a conventional semiconductor apparatus in which the third lead conductor does not have a low impedance when the semiconductor device is operated at a high speed.

According to an embodiment of the present invention, the semiconductor device substrate has a substantially rectangular shape wherein a first main electrode and a control electrode are formed on a first principal surface and a second main electrode is formed on a second principal surface, thereby keeping the impedances of first and second lead conductors and of a third lead conductor quite low. The first lead conductor comprises a sheet-like conductor having sufficient width and length to place the semiconductor device substrate thereon. The semiconductor device substrate and an insulator surrounding it are formed on the first lead conductor. The second and third lead conductors are supported on the insulator to oppose each other with the semiconductor device interposed therebetween. The width of each of the second and third lead conductors is greater than the distance between opposing portions thereof. In other words, end faces of the second and third lead conductors along the direction of length thereof face the corresponding long sides of the rectangular semiconductor device substrate, respectively, and each of the second and third lead conductors has a width substantially equal to or greater than the long side of the semiconductor device substrate. The first lead conductor is electrically connected to the second main electrode on the second principal surface of the semiconductor device substrate, either directly or through a molybdenum sheet. The second lead conductor is electrically connected to the first main electrode on the first principal surface of the semiconductor device substrate. The third lead conductor is electrically connected to the control electrode on the first principal surface of the semiconductor device substrate through a plurality of thin wires such as a bonding wire and a lead ribbon.

According to another embodiment of the present invention, a plurality of semiconductor device substrates are used and aligned in an array on a first lead conductor. In the same manner as in the first embodiment, second and third lead conductors are disposed at two sides of the array of semiconductor device substrates and oppose each other. The width of each of the second and third lead conductors is greater than the length (total) of the array of semiconductor device substrates.

According to the still another embodiment of the present invention, there is provided a flat semiconductor apparatus having first and second lead conductors opposing each other so as to sandwich a semiconductor device substrate therebetween, and a third lead conductor connected to a control electrode of the semiconductor device substrate at an intermediate portion of a cylindrical insulator for electrically isolating the first and second lead conductors, characterized in that the third lead conductor comprises a sheet-like body (which has at least one connecting portion) whose width is substantially equal to or greater than one side or a diameter of the semiconductor device substrate, and the connecting portion of the third conductor is electrically connected to the control electrode through pluralities of parallel bonding wires or ribbon lead wires.

BRIEF DESCRIPTION OF THE DRAWINGS

FIGS. 2A and 2B show a conventional ceramic case flat package in which a plurality of semiconductor substrates are packed, in which FIG. 2A is an exploded plan view thereof, and FIG. 2B is an exploded sectional view thereof;

FIGS. 5A and 5B show a semiconductor apparatus using a lead plate in place of all lead wires so as to decrease an inductance component according to an embodiment of the present invention, in which FIG. 5A is an exploded plan view thereof, and FIG. 5B is an exploded sectional view thereof;

FIGS. 11A and 11B show a semiconductor apparatus according to still another embodiment of the present invention, in which FIG. 11A is an exploded sectional view thereof, and FIG. 11B is an exploded plan view thereof;

FIGS. 12A and 12B and FIGS. 13A and 13B show semiconductor apparatuses according to still other embodiments of the present invention, respectively, in which FIGS. 12A and 13A are exploded sectional views, and FIGS. 12B and 13B are exploded plan views;

DETAILED DESCRIPTION OF THE PREFERRED EMBODIMENTS:

Before the preferred embodiments of the present invention are described, the conventional drawbacks are described in further detail with reference to the accompanying drawings in order to best understand the present invention.

Figure 1:
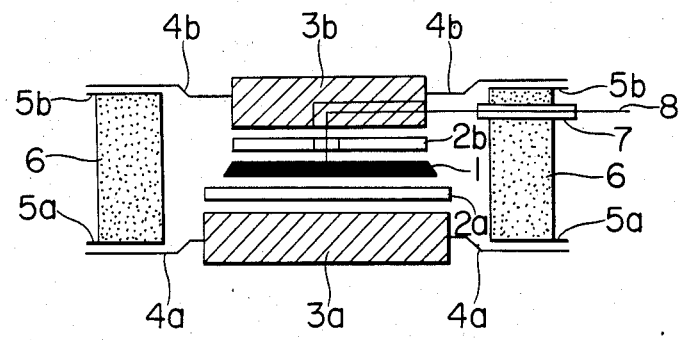
FIG. 1 is a cross-sectional view of a conventional ceramic seal package in which a semiconductor device is packed.

FIG. 1 is an exploded sectional view of a conventional ceramic seal package which a semiconductor device is packed. This package comprises a semiconductor device 1 such as a transistor or a thyristor, molybdenum sheets 2a and 2b, metal (e.g., copper) conductor blocks 3a and 3b, flanges 4a and 4b, welded plates 5a and 5b, a ceramic case 6, a seal pipe/control electrode hole 7, and a control electrode lead 8. This package generally has a cylindrical shape containing a single semiconductor device substrate. The package shown in FIG. 1 is not suitable for mounting a plurality of semiconductor device substrates. In general, in order to prepare a high-power semiconductor device for controlling a current of several hundreds of amperes, a plurality of semiconductor device substrates, each controlling a current of several tens of amperes to about 100 amperes, are mounted in parallel with each other in a package to obtain such a high-power semiconductor apparatus. In this manner, the area of each semiconductor device substrate may not be greatly increased. Furthermore, the yield can be increased when a plurality of semiconductor device substrates each having a proper size are prepared instead of preparing a single large-area, large-current semiconductor device substrate. However, it is difficult to mount a plurality of semiconductor device substrates in the conventional package as described above.

Figure 2A:
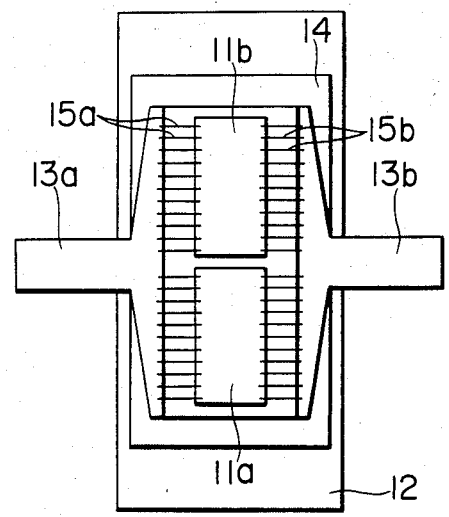
Figure 2B:
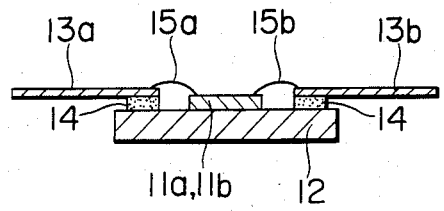

FIGS. 2A and 2B show a conventional ceramic case flat package in which two semiconductor device substrates 11a and 11b are mounted. Referring to FIGS. 2A and 2B, the package comprises semiconductor device substrates 11a and 11b, a metal base 12, electrode leads 13a and 13b, a ceramic case 14, and bonding wires 15a and 15b. In this example, the package is designed to mount a plurality of semiconductor device substrates therein. This package is used for a very high frequency apparatus. The semiconductor device substrate mounted in the flat package has a size smaller than that in a high-power semiconductor device substrate. In addition to this disadvantage, the electrode leads 13a and 13b have a small width to extend outside the package so as to allow easy impedance matching with a very high frequency circuit. Here, the electrode leads include a bonding portion connected to the electrode on the semiconductor device substrate through bonding wires or ribbon lead wires, a lead portion (metallized by deposition and printing on the ceramic portion) extending outside the ceramic case, and an electrode conductor brazed or plated on an external metallized portion.

Generally, a high-power circuit has an impedance which is about 1/10 of the impedance of a very high frequency circuit. The conventional semiconductor apparatus shown in FIGS. 2A and 2B cannot be used as a high-power semiconductor apparatus for switching a current of several hundreds of amperes at a high speed. This is also true when a thin wire is used for the control electrode lead 8 in FIG. 1.

Figure 3:
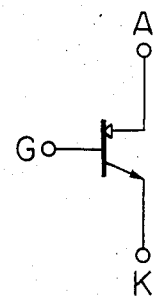
FIG. 3 shows an electric symbol of an n-channel static induction thyristor (SIThy)
Figure 4:
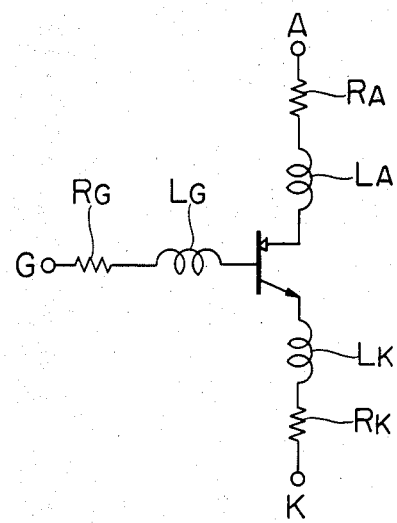
FIG. 4 shows a lumped-constant equivalent circuit when the SIThy is mounted in a package.

The above situation will be described with reference to a static induction thyristor (to be referred to as an SIThy hereinafter) as a high-current, high-speed switching semiconductor device. A typical n-channel SIThy has an anode A, a cathode K and a gate G, as shown in FIG. 3. A main current flows from the anode A to the cathode K. The gate G is used as a control electrode for controlling the main current such that the main current is either cut off or is allowed to flow from the anode A to the cathode K. In ideal switching operation, a gate signal from an external signal source triggers the gate G without delay so as to instantaneously perform ON/OFF operation of the main current. When the SIThy is in the on-state, a voltage drop between the anode A and the cathode K becomes nearly 0 V. However, when the SIThy is in the off-state, it has a very high blocking voltage. For example, when a current of several hundreds of amperes is applied to the SIThy, a voltage drop between the anode and the cathode is about 1 V or less. A blocking voltage at the off-state of the SIThy is several kilovolts. The switching time is about 0.1 μsec or less. FIG. 4 shows a lumped-constant equivalent circuit when this SIThy is mounted in the package. Referring to FIG. 4, reference symbols $R_A$ and $L_A$ denote a resistance and an inductance of the anode lead, respectively; $R_K$ and $L_K$, a resistance and an inductance of the cathode lead, respectively; and $R_G$ and $L_G$, a resistance and an inductance of the gate lead, respectively. These values correspond to the impedance of the SIThy package itself. A voltage drop is given as $RI+L(dI/dt)$ when a current I flows through a conductor having a resistance R and an inductance L for a given time interval t. For example, when a current of 100 A through a conductor having a resistance of 1 mΩ and an inductance of 10 nH changes within an interval of 0.1 μsec, the voltage drop becomes 10 V due to the inductance component of the conductor. On the basis of these considerations, the switching operation of the SIThy will now be considered. In general, in order to obtain a high speed turn-on of a semiconductor device (thyristor or transistor), a current flows into the gate or the base of the semiconductor device at a high speed to raise the voltage to a predetermined level. However, to obtain a high speed turn-off, the current must be absorbed at a high speed from the control electrode. In this case, in the conventional semiconductor device having the thin control electrode lead wire 8 (FIG. 1) or the narrow electrode leads 13a and 13b (FIGS. 2A and 2B), an external signal supplied to the control electrode of the semiconductor device is delayed due to the impedance of the lead wire or leads, and in some case overshooting occurs due to the inductance component of the device, thereby causing waveform distortion. In particular, when a high current semiconductor device such as a thyristor or a transistor is turned off, a large current must be absorbed from the control electrode. However, in this case, the above drawbacks become very substantial, thus preventing high-speed operation. Since a large number of electrons and holes are injected in the channel in the SIThy at a conducting state, electrons or holes must be absorbed by the control electrode at a turn-off operation. Therefore, when the turn-off speed is increased, an instantaneous current flowing through the control electrode is increased. This can be explained by equation (1) below. Turn-off time $t_{off}$ of the SIThy is approximately given by:

$$t_{off} = \tau_{eff} \ln(1 + I_A/I_{GP}) \qquad (1)$$

where $\tau_{eff}$ is the effective carrier lifetime, $I_A$ is the anode current and $I_{GP}$ is the peak gate current when the SIThy is turned off. Equation (1) indicates that the turn-off time $t_{off}$ is shortened when the peak gate current $I_{GP}$ is increased. If the gate impedance (including the external impedance) of the SIThy is given as $Z_G$, a voltage $I_{GP} \cdot Z_G$ cannot be greater than a reverse gate bias voltage $V_{GK}$. When the gate impedance $Z_G$ becomes smaller, a large peak gate current $I_{GP}$ can flow in accordance with a low voltage $V_{GK}$, thereby providing high-speed turn-off. In other words, the sum of the impedance of the control electrode of the device and the impedance of the control electrode lead of the package must be small for high-speed turn-off. In particular, when a large current is switched off at a high speed, the inductance component must be small. However, as previously described, a voltage drop of about 10 V occurs in response to a small inductance of about 10 nH. In order to compensate for this voltage drop, a drive circuit for driving the semiconductor device must apply to the semiconductor device a voltage higher than a rated voltage by a value corresponding to the above voltage drop. On the other hand, a voltage applicable to the control electrode of the semiconductor device is about several tens of volts at most. Therefore, a voltage applied to the control electrode is mostly dropped by the control electrode lead of the package for very high current and high speed switching, even if the inductance is small.

The self-inductance L of the control electrode lead having a diameter 2r and a length l is given as follows:

$$L = 82_0 a \ln \tan ((2l/r)-1)/2\pi \quad [H] \qquad (2)$$

and a self-inductance L of a conductor having the width W and a length l is given as follows:

$$L = \mu_0 l (\ln(2l/W) + \tfrac{1}{2} + W/3l)/2\pi \quad [H] \qquad (3)$$

For example, if 2r=1 mm and l=50 mm for the former, and W=5 mm and l=50 mm for the latter, the respective self-inductances L are given as 43 nH and 35.3 nH. In this case, high speed switching of a large current cannot be achieved due to the large inductance of the lead wire.

Consider the effects of the cathode and anode of the device. Each of the cathode and anode must have a sufficient area to withstand a current of several hundreds of amperes, since the main current to be controlled flows from the anode to the cathode. However, when the effects of the self-inductance of the cathode and anode are considered, the following problem is presented. Assume that the SIThy is in a transient state from the off-state to the on-state. In order to turn on the SIThy, a gate bias voltage must be increased from the off-state voltage $V_{GKoff}$ to the on-state voltate $V_{GKon}$. The gate bias voltages are measured on the basis of a cathode voltage as a reference voltage (i.e., the gate bias voltage is more precisely called a gate-cathode voltage). While the gate voltage is increasing from $V_{GKoff}$ to $V_{GKon}$, the main current starts to flow, so that the cathode voltage is increased by $L_K(dI/dt)$ due to the inductance of the cathode lead. An increase in cathode voltage causes a decrease in the gate-cathode voltage $V_{GK}$, thereby delaying the turn-on time. In other words, a negative feedback effect occurs due to the inductance. The above problem is also applicable to the turn-off operation and only the sign is reversed. This indicates that a gate drive circuit (not shown) must generate an additional voltage corresponding to the voltage drop. On the other hand, if W=50 mm and l=20 mm (i.e., a wide electrode lead is used), the self-inductance L of this electrode lead is decreased to 16.1 nH in accordance with equation (3). In this condition, when a current of 100 A flows through the electrode lead for a time interval of 0.1 μsec, a voltage drop of 16.1 V occurs. Therefore, high-speed switching of the large current cannot be achieved by following this line of improvement. It is also apparent from the above description that the anode lead cannot achieve high-speed switching from a voltage of several hundreds or several thousands volts to the low ON voltage of about 1 V due to the self-inductance. In this manner, in the lumped-constant model obtained only in consideration of self-inductances, as shown in FIG. 4, high-speed switching of the large current cannot be achieved, and the package must be constructed as a distributed-constant circuit, like a transmission line.

The present invention has been made on the basis of analysis of the prior art described above and has for its object to provide a semiconductor apparatus for controlling a large current at a high speed by using electrode lead plates (or sheet-like lead conductors) having a large width to obtain a desired low impedance.

Figure 5A:
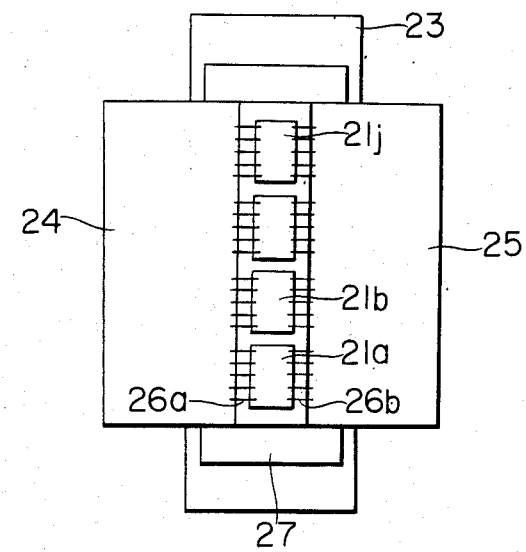
Figure 5B:
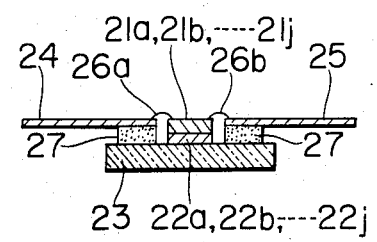

The present invention will be described in detail with reference to the accompanying drawings. FIG. 5A is an exploded plan view of a semiconductor apparatus according to an embodiment wherein all the electrode lead conductors are made of a sheet-like conductor to decrease the inductance component, and FIG. 5B is an exploded sectional view thereof. The semiconductor apparatus includes semiconductor devices 21a, 21b, ... , and 21j such as a thyristor and a transistor, molybdenum plates 22a, 22b, ... , and 22j, a conductor base 23 as a first lead conductor electrically coupled to respective second principal surfaces of the devices, a conductor lead plate 24 as a second lead conductor coupled to main electrodes on respective first principal surfaces of the devices, a conductor lead plate 25 as a third lead conductor electrically coupled to control electrodes on the respective first principal surfaces of the devices, bonding lead wires (or ribbon leads) 26a and 26b, and an insulating ceramic case 27. The conductor lead plates 24 and 25 as electrodes include a bonding portion connected to the electrode on the semiconductor device substrate through the bonding wires or the ribbon lead wires, a lead portion (metallized by deposition and printing on the ceramic portion) extending outside the ceramic case, and an electrode conductor brazed or plated on an external metallized portion. The bonding portion, the lead portion and the electrode conductor may be formed by a single strip of conductor. The conductor base 23 is generally made of a metal having good electrical and heat conduction characteristics. A plurality of molybdenum plates 22 are used in the above embodiment. However, a single molybdenum plate may be used instead of the plurality of molybdenum plates. The length of the electrode conductor base 23 and the width of each of the conductor lead plates 24 and 25 is greater than the sum of lengths of the plurality of the semiconductor device substrates. Each of the conductor lead plates 24 and 25 has a width larger than the distance therebetween. All the semiconductor devices can be mounted on the electrode conductor base 23. The electrodes of all the semiconductor devices are electrically connected to the conductor lead plates 24 and 25 through parallel bonding lead wires 26a and 26b.

In the above embodiment, the semiconductor devices 21a, 21b, ... and 21j are separated from each other. However, they need not be separated from each other. The semiconductor devices 21a, 21b, ..., and 21j may be formed in an elongated substrate of a single silicon wafer. Alternatively, groups of semiconductor devices each consisting of a predetermined number of semiconductor devices may be arranged in an array. These modifications may be determined in consideration of the yield of semiconductor devices in the manufacturing process and the yield in the process for uniformly bonding the semiconductor device on the molybdenum plate so as to achieve low manufacturing cost in accordance with various levels of technical specifications. It is very important to avoid local concentration of current flow at a high-speed operation and hence to prevent an increase in the inductance component, thereby providing a distributed-constant circuit.

Referring to FIGS. 5A and 5B, the conductor lead plates 24 and 25 are electrically connected to the semiconductor devices through bonding wires or ribbon leads. These bonding wires or ribbon leads are the portions of the structure in FIGS. 5A and 5B which are subject to the highest current concentrations. Therefore, the distances between the conductor lead plate 24 and one side of each of the semiconductor devices and between the conductor lead plate 25 and the other side of each of the semiconductor devices must be minimized within the physical limitations. On the other hand, when the width of the semiconductor device between the conductor lead plates 24 and 25 is too great, the inductance of the metal electrode wiring on the semiconductor device is increased, so the width of the semiconductor devices cannot be increased so much. The entire area of the semiconductor devices must be increased when a large current flows therethrough. As a result, as shown in FIG. 5A, the semiconductors must be aligned in an array along one direction. The width of the package in a direction perpendicular to the direction of current flow through the conductor lead plates 24 and 25 must be larger than the distance between the conductor lead plates 24 and 25. For example, in an SIThy having a basic channel having a stripe structure (the cathode to anode distance is 450 μm; the p+-type gate diffusion depth is 4 μm; and a distance between paired p+gate is 1.5 μm), the channel current density is 800 A/cm$^2$, and the ON voltage is 1.0 to 1.2 V. In order to prepare an SIThy for controlling an average current of 100 A, a chip size thereof becomes about 7×40 mm$^2$. In other words, the width of the semiconductor device along a line connecting the conductor lead plates 24 and 25 is 7 mm, and the length thereof in the direction perpendicular to the current flow direction is 40 mm. In this case, the distance between the conductor lead plates 24 and 25 is about 10 mm, and the width of the lead plates 24 and 25 in the direction perpendicular to the current flow direction is about 40 mm.

The package having the structure described above is in general mounted on a large conductor plate. Therefore, the control electrode lead, the anode and the cathode serve as transmission lines. When the package has such a transmission line structure, the self-inductance is not an important factor, but mutual inductance has an important effect.

The wide electrode lead plate (behaving like a transmission line) of the present invention is compared with the conventional narrow electrode lead wire and the conventional narrow electrode lead plate. When a lead comprise a thick wire having a diameter 2r, and two thick wires are spaced apart by a distance D to be parallel with each other in the air, a characteristic impedance $Z_0$ of the wire is given by "equation" (4) as follows:

$$Z_0 = \{\sqrt{\mu_0/\epsilon_0} \ \ln(2D/r)\}/2\pi \ [\Omega] \quad (4)$$

On the other hand, when a lead comprises a conductor plate having a width W, and the two conductor plates are mounted on a wide conductor plate to be spaced apart by a distance D, the characteristic impedance of the conductor plate having the width W is given by approximation (5) as follows:

$$Z_0 \approx 377/(W/D)\{1+1.735(W/D)^{-0.836}\} \ [\Omega] \quad (5)$$

If r=0.5 mm and D=5 mm are substituted in equation (4), the impedance of the wire is given as:

$$Z_0 \approx 180 \ [\Omega] \quad (6)$$

If W=5 mm and D=5 mm, the impedance of a narrow conductor plate is given in accordance with approximation (5):

$$Z_0 \approx 138 \ [\Omega] \quad (7)$$

If W=50 mm and D=5 mm, the impedance of a wide conductor plate is given in accordance with approximation (5):

$$Z_0 \approx 30 \ [\Omega] \quad (8)$$

As may be apparent from approximations (6), (7) and (8), the wide conductor plate has a lower impedance than those of the wire and the narrow conductor plate. When a high-power device, especially a large-current device, is used the input and output impedances of the device are decreased, so that an input/output circuit having a low impedance is preferred. In particular, when a semiconductor device such as an SIThy performs high-speed switching of a large current, a large gate current must be absorbed into the gate in the turn-off operation. Therefore, a decrease in impedance of all electrode leads of the device according to the present invention is greatly advantageous in that the device can control a large current at a high speed.

Figure 6:
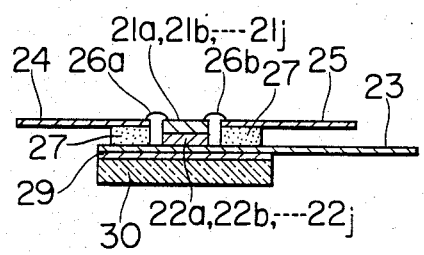
FIG. 6 is an exploded sectional view of a semiconductor apparatus according to another embodiment of the present invention, wherein a metal base (also serving as a heat sink) for fixing the semiconductor device and the conductors as electrodes for the semiconductor device substrate are electrically insulated.
Figure 7:
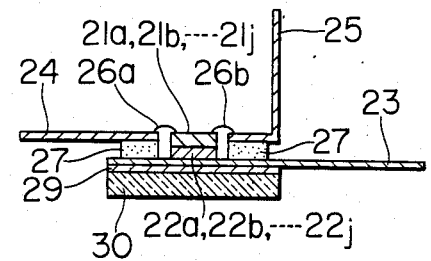
FIG. 7 is an exploded sectional view of a semiconductor apparatus according to still another embodiment of the present invention, wherein an electrode extends perpendicularly to the surface of the semiconductor device substrate, unlike the electrode of the apparatus shown in FIG. 6.

In the embodiment shown in FIGS. 5A and 5B, the semiconductor device substrates are mounted on the conductor base which serves as an electrode. However, a metal base for mounting the semiconductor apparatus to dissipate heat therefrom may be preferably adopted, electrically insulated from a conductor plate serving as the electrode to mount the semiconductor device substrates thereon, as shown in FIG. 6. It may be preferred that the gate electrode extend perpendicularly to the principal surface of the semiconductor device substrate, as shown in FIG. 7. The same reference numerals as used in FIGS. 5A and 5B denote the same parts in the embodiments shown in FIGS. 6 and 7. Referring to FIGS. 6 and 7, reference numeral 29 denotes an insulating plate made of a material such as silicon carbide, beryllia and alumina; and 30, a metal base made of a material such as copper.

A control electrode (e.g., a gate and a base) is generally formed in the vicinity of a carrier injection main electrode (e.g., a source, an emitter, and a cathode) in a semiconductor device (e.g., a bipolar mode SIT (BSIT), a bipolar junction transistor (BJT), and a gate turn-on (GTO) thyristor). In the exploded plan view of the semiconductor substrate shown in FIG. 5A, the conductor lead plates 24 and 25 serve as leads connected to the control electrode and the carrier injection main electrode, respectively. The conductor base 23 serves as a lead for the carrier withdrawal main electrode such as a drain, a collector or an anode.

In a high-power, high-frequency control circuit, a carrier injection electrode generally serves as a common potential terminal. For example, when the conductor lead plate 25 is used as the carrier injection main electrode, a practical implementation can be obtained even if the conductor lead plate 25 has a shape as shown in FIGS. 5A and 5B, FIG. 6, or FIG. 7. However, in fact, a slight modification may be required. For example, the structures in FIGS. 8 and 9 may be effectively used to provide a simple circuit configuration.

Figure 8:
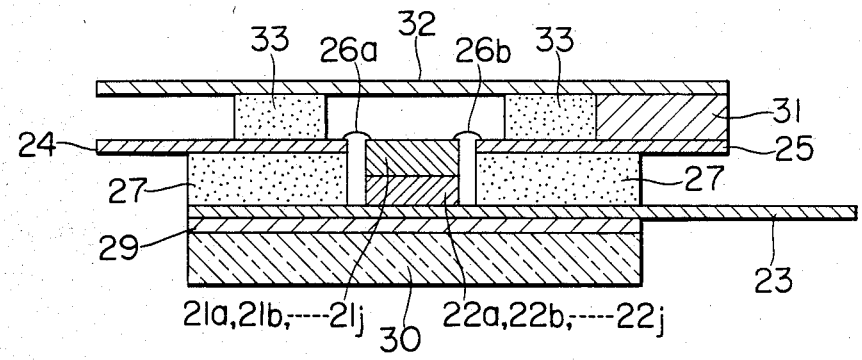
FIG. 8 is an exploded sectional view of a semiconductor apparatus which allows easy circuit design when a carrier injection main electrode is used as a common ground terminal according to still another embodiment of the present invention.

Referring to FIG. 8, the basic structure is the same as those in FIGS. 5B, 6 and 7. The structure shown in FIG. 8 allows an easy circuit arrangement when the carrier injection main electrode is used as the common potential terminal. Referring to FIG. 8, reference numeral 31 denotes a metal such as copper; 32, a metal plate made of a material such as copper; and 33, a ceramic insulator. In the semiconductor apparatus having the construction described above, the carrier injection main electrode serving as the common potential terminal is connected to the large metal plate 32 through the metal 31, so that the large metal plate 32 is set at the common potential, and the circuit arrangement can be simplified. Therefore, a control electrode drive circuit and a main electrode circuit are arranged on the large copper plate at two sides of the semiconductor device, thereby readily achieving a distributed-constant circuit. When a semiconductor device has a high breakdown voltage of several thousands of volts, the conductor lead plate 24 serving as the control electrode and the conductor lead plate 23 serving as the carrier withdrawal main electrode, as shown in FIG. 8, are preferably bent downward to be perpendicular to the remaining portions thereof.

Figure 9:
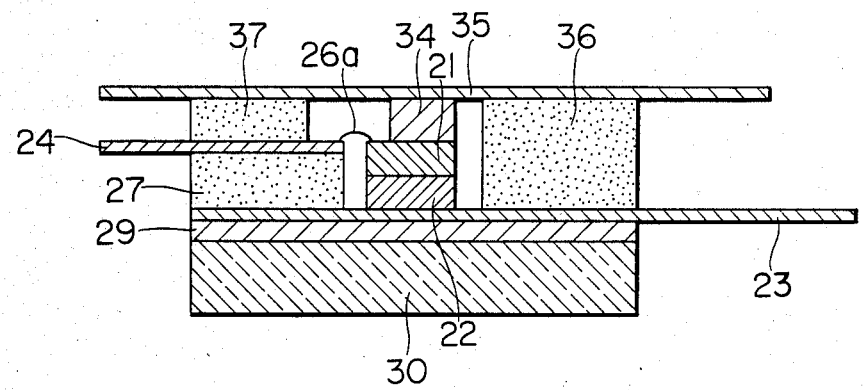
FIG. 9 is an exploded sectional view of a semiconductor apparatus having a structure in which a carrier injection main electrode is connected to a conductor plate lead through a molybdenum sheet according to still another embodiment of the present invention.

In the embodiment shown in FIG. 8, heat dissipation of the device is performed through a molybdenum plate 22, the conductor base 23, an insulating plate 29, and a metal base 30. It is possible to perform heat dissipation from the upper side of the device, as shown in FIG. 9. The apparatus in FIG. 9 does not have a plurality of chips but has a single chip. A carrier injection main electrode of the semiconductor device is connected to a conductor lead plate 35 through a molybdenum plate 34. Reference numerals 36 and 37 denote ceramic insulators. These insulators are perferably made of beryllia or silicon carbide having high heat conduction. In the structure shown in FIG. 9, the carrier injection main electrode is connected to the conductor lead plate 35 serving as the main electrode through the molybdenum plate 34 and a copper plate (if needed). Since bonding wires or ribbon leads are not used, the inductance of the structure is further decreased to provide a substantially ideal package. The inductance of the electrode serving as the common potential terminal must be small since it has a negative feedback function, as previously described.

The semiconductor apparatus having the structure in FIG. 9 is suitable for switching a large current at a high speed due to a small inductance thereof, for easy circuit arrangement, and for effective heat dissipation.

Figure 10:
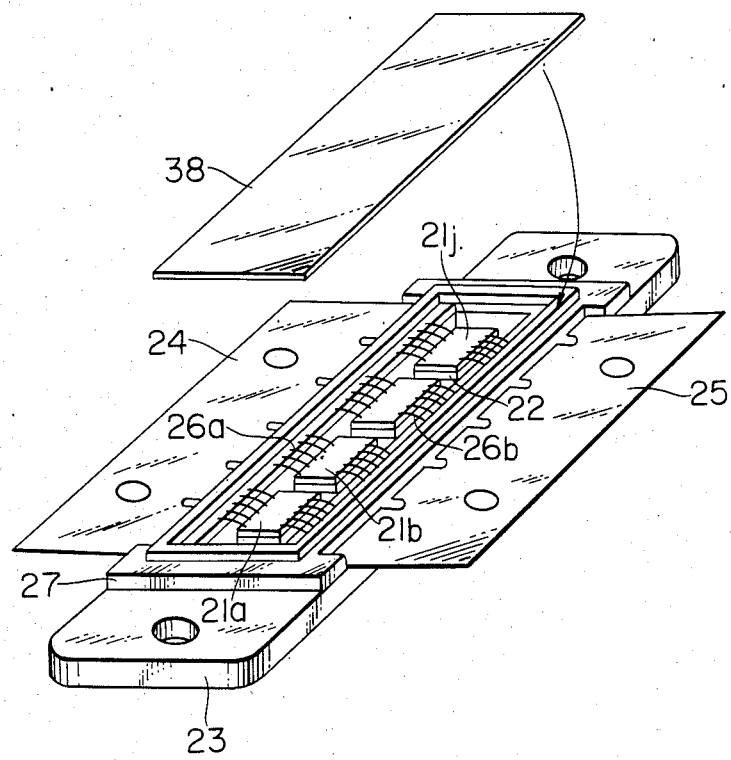
FIG. 10 is a perspective view showing the detailed structure of the apparatus shown in FIGS. 5A and 5B.

In FIGS. 5B, 6, 7, 8 and 9, only the main parts are illustrated to emphasize the electrode lead structure as the main feature of the present invention, so that a seal member and the like are omitted. FIG. 10 is a perspective view of the semiconductor apparatus shown in FIGS. 5A and 5B. A current flowing in the conductor lead plate 24 serving as the control electrode is smaller than that in the conductor lead plate 25. The width of the conductor lead plate 24 may be slightly smaller than that of the conductor lead plate 25. It should be noted in FIG. 10 that reference numeral 38 denotes a seal plate.

Figure 11A:
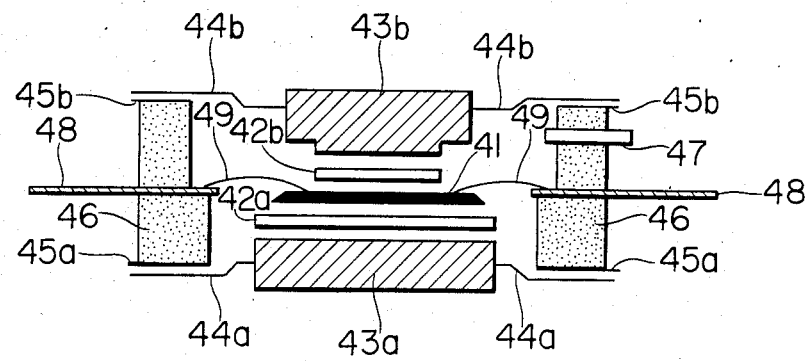
Figure 11B:
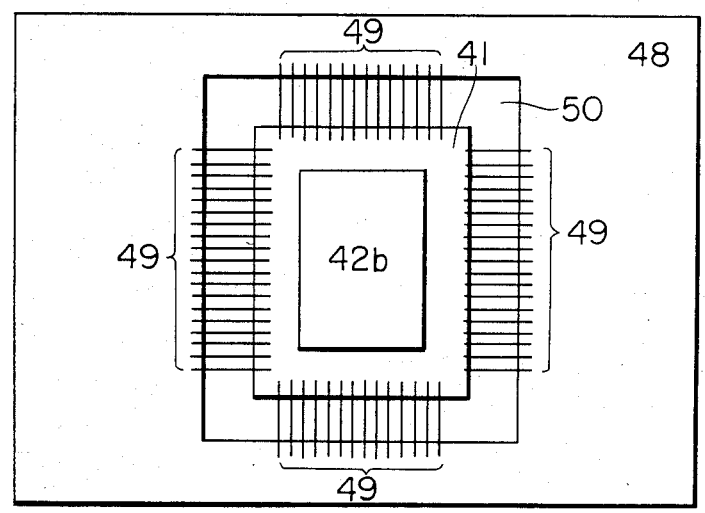
Figure 12A:
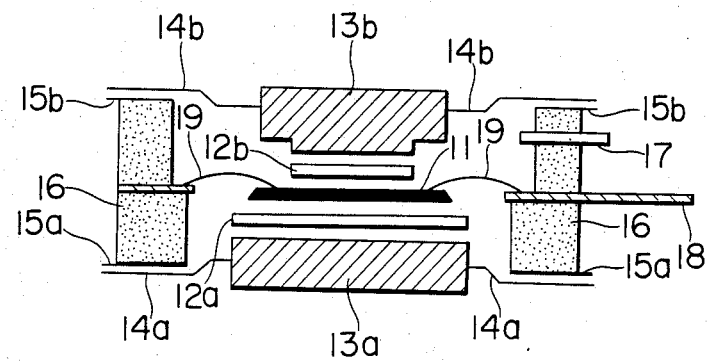
Figure 12B:
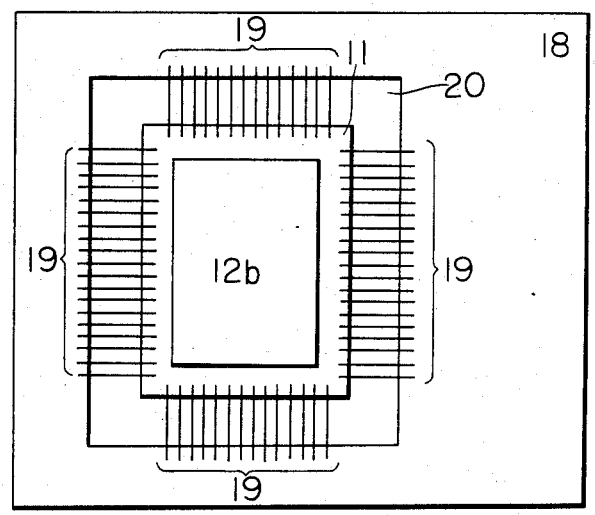
Figure 13A:
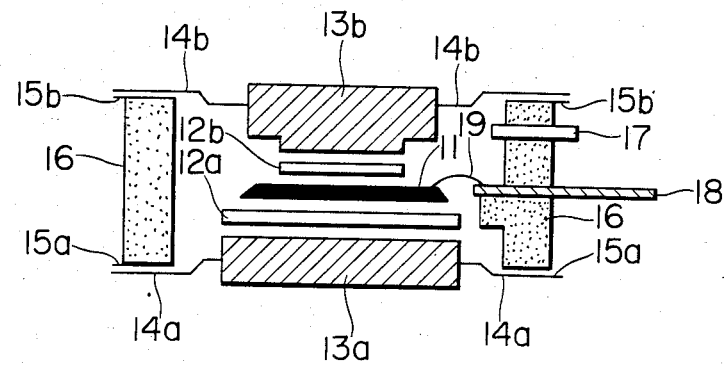
Figure 13B:
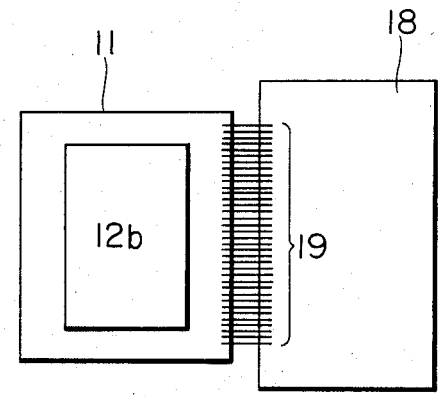

FIG. 11A is an exploded sectional view of a semiconductor apparatus having a control electrode lead plate to decrease the inductance component thereof according to still another embodiment of the present invention, and FIG. 11B is an exploded plan view thereof.

This apparatus includes a semiconductor device 41 such as a thyristor and a transistor, molybdenum plates 42a and 42b, conductor blocks 43a and 43b made of a material such as copper, flanges 44a and 44b, welded plates 45a and 45b, an insulating ceramic case 46, a seal pipe 47, a gate electrode lead plate 48, and bonding wire leads (or ribbon leads) 49. The gate electrode lead plate 48 has a rectangular punched portion 50, as shown in FIG. 11B. The semiconductor device 41 is disposed corresponding to the rectangular punched portion 50. The control electrode of the semiconductor device 41 is electrically connected to the connecting portion of the plate 48 through the plurality of parallel bonding wire leads 49.

The package having the structure described above is generally mounted on a large conductor plate. Therefore, the control electrode lead plate and the anode and drain lead portions serve as transmission lines. Therefore, the self-inductance does not have a substantial effect, but the mutual inductance does. When a high-power device, especially a large-current device is used, input and output impedances of the device are decreased, so that an input-output circuit having a low impedance is preferred. In particular, when a semiconductor device such as an SIThy performs high-speed switching of a large current, a large gate current must be absorbed in the turn-off operation. Therefore, a decrease in impedance of all electrode leads of the device according to the present invention is greatly advantageous in that the device can control a large current at a high speed.

In the semiconductor apparatus in FIG. 11A, two ends of the gate electrode lead plate extend through the insulator. However, in the case of arranging the general semiconductor circuit, a gate control circuit is arranged on one side of the semiconductor device, and a carrier withdrawal electrode (drain or anode) circuit is arranged on the other side thereof. Therefore, it is sufficient to extend the gate control electrode along one side of the semiconductor device, as shown in FIGS. 12A and 12B or FIGS. 13A and 13B. The same reference numerals as used in FIGS. 11A and 11B denote the same parts in FIGS. 12A and 12B and FIGS. 13A and 13B. In the apparatus in FIGS. 12A and 12B or FIGS. 14A and 14B, a gate current and a drain or anode current are not concentrated but distributed. Even if a large copper plate is used, a current is concentrated when a narrow portion is present in the signal path, thus resulting in a large inductance. As a result, a large voltage drop occurs when a current is switched at a high speed.

In the above embodiment, the first and second main electrodes are the carrier injection main electrode and the carrier withdrawal main electrode, respectively. However the roles of the first and second main electrodes may be reversed. In other words, the first and second main electrodes may be the carrier withdrawal main electrode and the carrier injection main electrode, respectively, so as to obtain the same effect of the present invention.

As may be apparent from the various embodiments of the present invention, the semiconductor device substrate of the semiconductor apparatus has a rectangular shape irrespective of whether its structure has a plurality of chips or is an integrated structure having a single chip. The inner end face of the conductor lead plate along the direction of length thereof opposes the long side of the semiconductor device and has a width greater than that of the long side of the semiconductor device. The width of the conductor lead plate is greater than the distance between this conductor lead plate and the opposing conductor lead plate.

Figure 14:
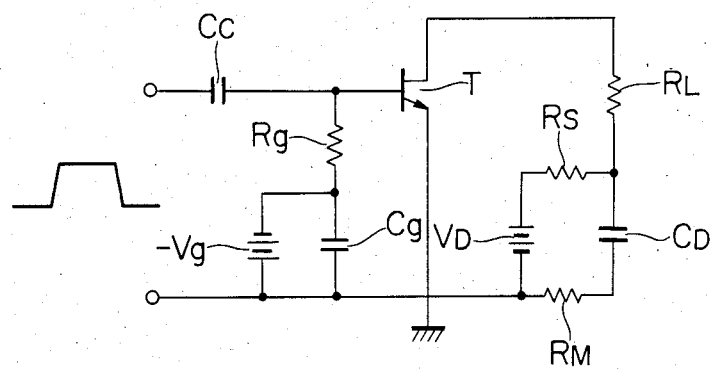
FIG. 14 is a circuit diagram for checking characteristics of the semiconductor apparatus of the present invention.

In order to show an effect of the wide electrode of the present invention, an experiment is carried out using a commercially available high-frequency capacitor (capacitance: 10 μF; breakdown voltage: 2,000 V; and volume: $60 \times 100 \times 150$ mm$^3$) having two terminals at its upper portion. A switching circuit shown in FIG. 14 is arranged, using a semiconductor device T of the present invention, to control a high-frequency large current. The semiconductor device T can switch a current of 200 A. In order to check switching operation of this current, resistances $R_L$ and $R_M$ are given as 0 Ω and 0.01 Ω, respectively.

Figure 15A:
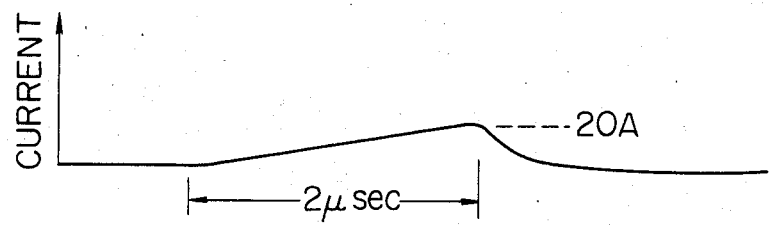
FIG. 15A shows a switching waveform of the semiconductor apparatus when lead wires of capacitors $C_D$ and $C_g$ have a large inductance.

The high-frequency 10-μF capacitors described above were used as capacitors $C_D$ and $C_g$. One of the terminals of each of the capacitors $C_D$ and $C_g$ was connected to a meshed wire having a width of 2 cm and a length of about 10 cm. A total length of 20 cm of the meshed wire was used. A switching waveform of a signal from this high-frequency switching circuit is shown in FIG. 15A. As may be apparent from FIG. 15A, the leading and trailing edges of the signal are not very steep. In addition to this disadvantage, current does not substantially flow. This is because a voltage drop occurs due to the inductance of the wide meshed wires connected to the capacitors.

Figure 15B:
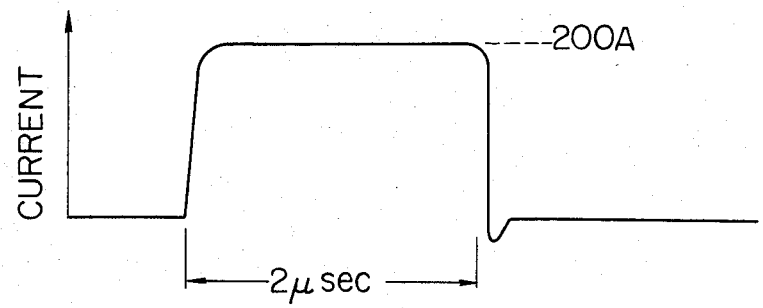
FIG. 15B shows a switching waveform of the semiconductor apparatus when the lead wires of capacitors $C_D$ and $C_g$ have a small effective inductance.

Capacitors each having a small capacitance and two leads respectively at its two ends were connected in parallel with each other to provide a capacitor unit having a total capacitance of 300 μF. The inductance of the leads was decreased, and the current was not concentrated in thin lead portions, so that the effective inductance was further decreased. A waveform of a signal in this condition is shown in FIG. 15B. A current of 200 A was switched off in a switching time of 0.15 μsec or less.

Figure 16:
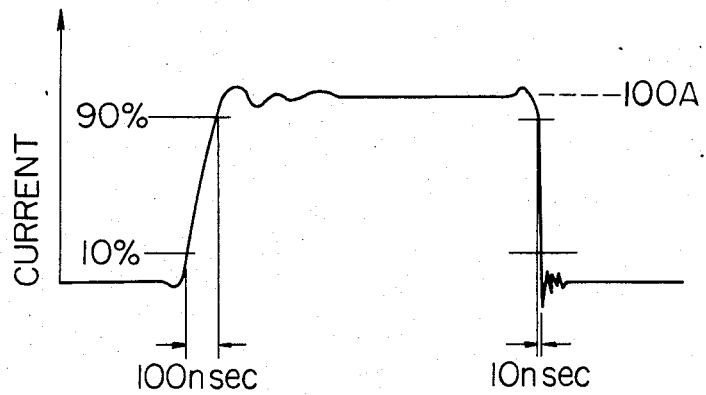
FIG. 16 shows a switching waveform when the semiconductor apparatus (of the present invention) having a bipolar mode static induction transistor (BSIT) therein is used in the package shown in FIG. 10 and performs switching of a large current with the circuit diagram shown in FIG. 14.

Furthermore, the capacitor $C_D$ was modified to modify the circuit (FIG. 14) such that the circuit had substantially no lead inductance. A bipolar mode SIT (BSIT) having a chip size of 7×40 mm hu 2 was mounted in the package shown in FIG. 10, and high-frequency switching of a large current was performed. Excellent results were obtained such that the ON voltage was 0.7 V, the current was 100 A, the turn-on time was 0.1 μsec, and a turn-off time was 10 nsec. A waveform of the signal is shown in FIG. 16. A high-speed switching operation of a current of 100 A in 10 nsec has never been achieved in the prior art. The voltage at this high-speed switching was 300 V when the load resistance $R_L$ was set at 3 Ω. Such high-speed switching cannot be performed in a conventional package having a BSIT.

The effect of decreasing the lead inductance by distributing the current can be typically observed in the experiment described above. The experimental results of the present invention also indicate that a high-speed semiconductor device cannot be used unless a circuit arrangement including the package mounting the semiconductor device and the construction of circuit elements including a capacitor and a resistor are suitable for high-speed operation.

The semiconductor apparatus according to the present invention allows high-speed switching of a current falling within a range between several tens of amperes and several thousands of amperes, thereby effectively controlling a large current. Furthermore, the operating frequency of the apparatus exceeds a range of audio frequencies, so that an operator is not adversely affected by high-frequency noise, and the apparatus has a small switching loss. The semiconductor apparatus of the present invention permits easy circuit design and provides a wide range of industrial applications.

What is claimed is:

1. A semiconductor apparatus for controlling large current at high speed, comprising:
   a plurality of rectangular semiconductor device substrates each having first and second principal surfaces and including a first main electrode and a control electrode on said first principal surface and a second main electrode on said second principal surface,
   a first lead conductor of sheet-like metal having good thermal conductivity, said plurality of semiconductor device substrates being aligned in an array on said first lead conductor, said first lead conductor having a sufficient width and length for the placement of said plurality of semiconductor device substrates thereon, said first conductor being electrically connected to said second main electrode,
   an insulator surrounding said plurality of semiconductor device substrates, and
   relatively wide second and third sheet-like lead conductors having substantially constant widths along the entire current paths and electrically insulated from each other in spaced opposed relationship with the array of said semiconductor device substrates interposed therebetween, said second and third lead conductors each having a width greater than the spacing therebetween and at least equal to the sum of the longer sides of said plurality of semiconductor device substrates, said second lead conductor being electrically connected to said first main electrode of each of said semiconductor device substrates, and said third lead conductor being electrically connected to said control electrode of each of said semiconductor device substrates.

2. An apparatus according to claim 1 wherein
   said first lead conductor is connected to said second main electrode on said second principal surface by a molybdenum plate, and
   said second and third lead conductors are connected to said first main electrode on said first principal surface and to said control electrode on said first principal surface, respectively, by a plurality of thin connectors.

3. An apparatus according to claim 2, further comprising a conductor plate supported on said second and third lead conductors by an insulator, said second lead conductor being connected to said conductor plate by a conductor.

4. An apparatus according to claim 1 wherein a portion of one of said first to third lead conductors is bent perpendicularly to a remaining portion thereof.

5. An apparatus according to claim, 1 wherein said first lead conductor is connected to said second main electrode on said second major surface by a molybdenum plate,
   said third lead conductor is connected to said control electrode on said first major surface by a plurality of thin, connectors and
   said second lead conductor is on an insulator on said third lead conductor and on another insulator on said first lead conductor, and said first main electrode is electrically connected to said second lead conductor by a further molybdenum plate.

6. An apparatus according to claim 1 wherein said second and third lead conductors are rectangular in shape.

7. An apparatus according to claim 6 wherein said first lead conductor is of rectangular shape.

8. An apparatus according to claim 7 wherein the dimensions and materials of said conductors and said semiconductor device substrates permit switching of currents between tens and thousands of amperes at high speed.

* * * * *